United States Patent [19]
Tanabe

[11] Patent Number: 6,002,608
[45] Date of Patent: Dec. 14, 1999

[54] FERROELECTRIC MEMORY AND WRITING METHOD OF THEREIN

[75] Inventor: Nobuhiro Tanabe, Tokyo, Japan

[73] Assignee: NEC Corporation, Tokyo, Japan

[21] Appl. No.: 09/094,729

[22] Filed: Jun. 15, 1998

[30] Foreign Application Priority Data

Jun. 16, 1997 [JP] Japan ..................................... 9-158793

[51] Int. Cl.⁶ ............................. G11C 11/22; G11C 11/24
[52] U.S. Cl. ........................................... 365/145; 365/149
[58] Field of Search ..................................... 365/145, 149

[56] References Cited

U.S. PATENT DOCUMENTS

| 4,853,893 | 8/1989 | Eaton, Jr. et al. ....................... 365/145 |
| 5,629,888 | 5/1997 | Saito et al. ............................... 365/145 |

FOREIGN PATENT DOCUMENTS

| 64-66897 | 3/1989 | Japan . |
| 2110893 | 4/1990 | Japan . |
| 2301093 | 12/1990 | Japan . |
| 4228191 | 8/1992 | Japan . |
| 4330696 | 11/1992 | Japan . |
| 4367120 | 12/1992 | Japan . |
| 5-13774 | 1/1993 | Japan . |
| 5242667 | 9/1993 | Japan . |
| 8171793 | 7/1996 | Japan . |

*Primary Examiner*—Trong Phan
*Attorney, Agent, or Firm*—Sughrue, Mion, Zinn, Macpeak & Seas, PLLC

[57] ABSTRACT

In a ferroelectric memory, a malfunction in which data are reversed at the time of writing after reading out of data is prevented. Using a transistor to short-circuit two common lines which are connected to a memory element, the two common lines are short-circuited at the preparing stage for writing new data, and thereby such a malfunction which occurs reversal of data owing to an electric potential difference between common lines is prevented.

4 Claims, 5 Drawing Sheets

FERROELECTRIC MEMORY AND WRITING METHOD OF THEREIN

BACKGROUND OF THE INVENTION

1. Field of the Invention

The present invention relates to a ferroelectric memory, and more particularly, to a ferroelectric memory in which a memory cell comprises ferroelectric capacitor elements to store memory formed on a semiconductor substrate and a switching transistor and a method of preparation for writing therein.

2. Description of the Related Arts

In a conventional ferroelectric memory, there has been employed a method of data storage utilizing two ferroelectric capacitors connected in series, as shown, for example, in Japanese Patent Application Laid-Open No. 66897/89.

FIG. 1 is a diagram showing an arrangement of the ferroelectric memory utilizing two ferroelectric capacitors connected in series as shown in Japanese Patent Application Laid-Open No. 66897/89. Each of memory elements 120, 122, 124 and 126 is a memory element utilizing two ferroelectric capacitors connected to a memory cell transistor in series. A first word line 130 is coupled to gate electrodes of transistors within memory elements 120 and 122. A second word line 132 is coupled to gate electrodes of transistors within memory elements 124 and 126. A first bit line 134 and a second bit line 136 intersect the word lines 130 and 132 at right angles. A first pair of common lines 138 and 140 is capacity-coupled to each drain electrode of two ferroelectric capacitors within memory elements 120 and 122. A second pair of common lines 142 and 144 is capacity-coupled to each drain electrode of two ferroelectric capacitors within memory elements 124 and 126.

FIG. 2 is a timing diagram of the memory arrangement shown in FIG. 1. A method of reading data which are stored in memory elements 120 and 122 and writing new data to the memory after the reading out will be described hereinafter.

At time $T_0$, each of bit lines 134 and 136 is charged to 2.5 V preliminary. By raising electric potential of the common line 138 to 5 V at time $T_1$ and, subsequently, electric potential of word line 130 to 5 V at time $T_2$, each of electric potentials of bit lines 134 and 136 either goes up or down immediately after $T_2$ at time $T_3$, depending upon whether data are stored in memory elements 120 and 122. Signals generated on the bit lines 134 and 136 are then bound to be at either 5 V or 0 V at time $T_4$, by sense amplifiers 146 and 148 which are coupled to the bit lines 134 and 136, respectively, and operate in differential mode.

Then, in order to write new data on memory elements 120 and 122 at time $T_5$, electric potential of word line 130 is raised to 7 V and electric potential of common line 138 is dropped to 0 V. Next, electric potentials of common lines 138 and 140 are changed to 5 V at time $T_6$ and electric potentials of common lines 138 and 140 are changed to 0 V at time $T_7$. Further, electric potential of word line 130 is set to 0 V at time $T_8$ and electric potentials of bit lines 134 and 136 are recharged to 2.5 V at time $T_9$. Now, it is ready to respond for the next writing.

However, the related arts described above have the following problem. That is to say, because of independent setting of common lines 138 and 140, when both of their electric potentials are changed at time $T_6$ or $T_7$, the timing of these changes can be slightly off, which brings about a difference between electric potentials of the common lines 138 and 140, reverses the polarization of ferroelectric capacitors and thereby results a deflection in writing data.

SUMMARY OF THE INVENTION

An object of the present invention is to provide a highly reliable ferroelectric memory by preventing the data reversal caused by a time lag between times when actual changes in electric potentials of two common lines may take place upon changing those electric potentials simultaneously.

A ferroelectric memory according to the present invention comprises:

a memory cell transistor;

a word line connected to a gate electrode of the memory cell transistor;

a bit line connected to either a source electrode or a drain electrode of the memory cell transistor;

two ferroelectric capacitors connected in series, through a shared terminal, to the other electrode but the eclectode connected to the bit line; and two common lines, each connected to the other terminal but the shared one of the two ferroelectric capacitors;

further comprising a coupling transistor for coupling of the two common lines, in which a gate electrode is voltage controllable and a drain electrode and a source electrode are connected to each of the two common lines; and means for bringing the transistor for coupling of the two common lines into a conducting state at the time of data writing after reading out, so that the two common lines are short-circuited and thereby setting two common lines connected to one and the same memory element to be at the same electric potential, through the coupling tranistor, at the time of data writing, prevents data reversal resulting from a difference in electric potential which may be generated between two common lines.

DESCRIPTION OF THE PREFERRED EMBODIMENT

Figure 1:
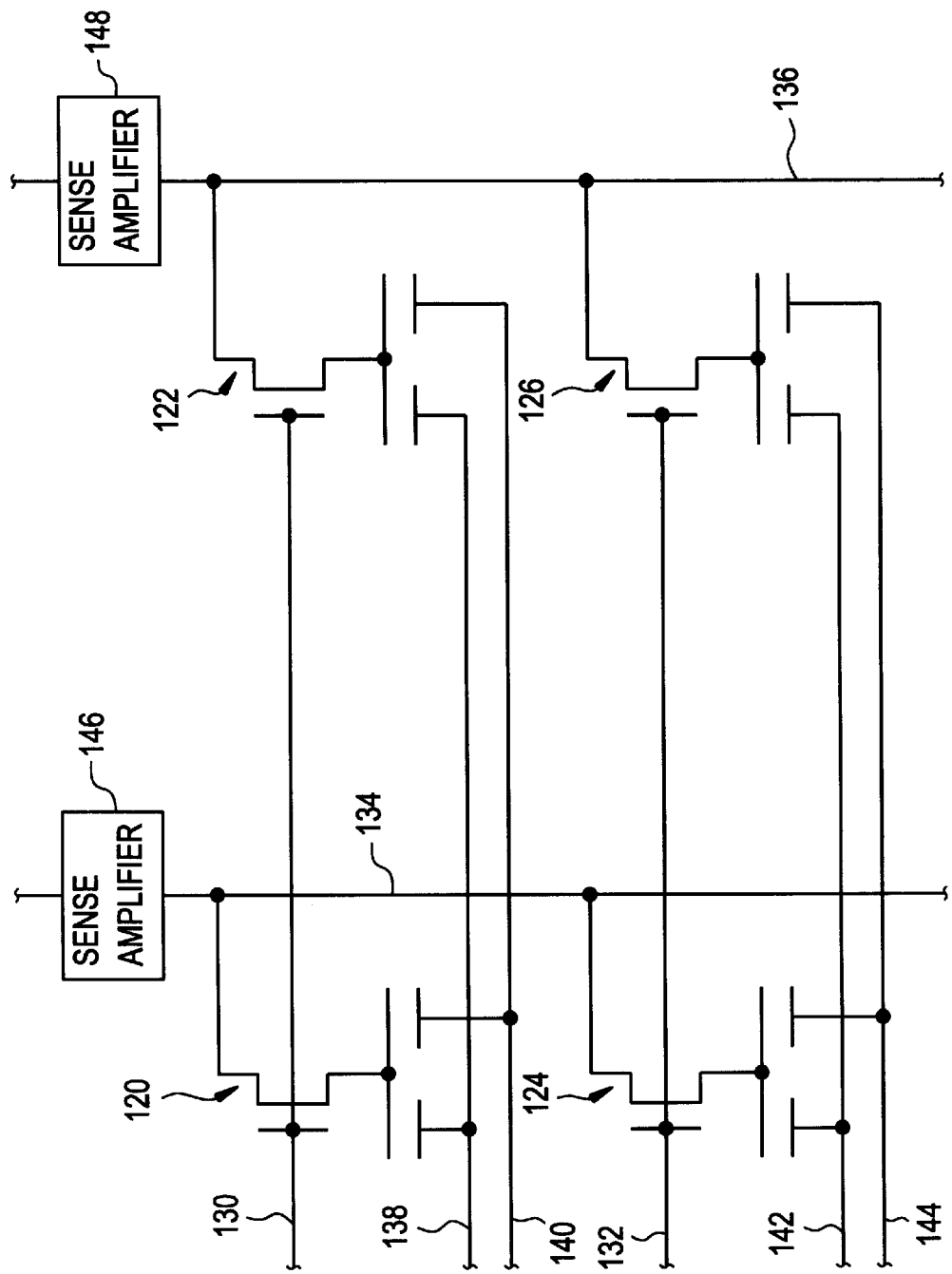
FIG. 1 is a circuit diagram of one example of prior art ferroelectric memories.
Figure 2:
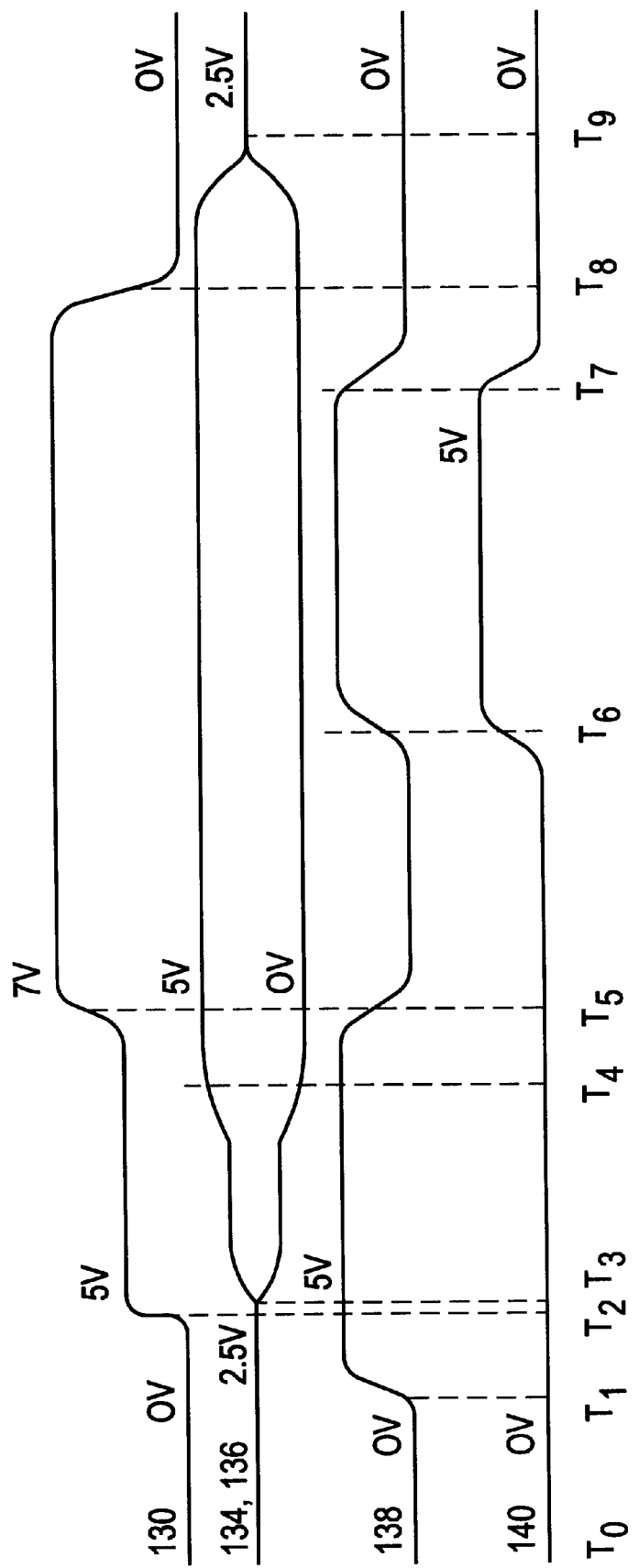
FIG. 2 is a timing chart, illustrating reading and writing operations of the ferroelectric memory of FIG. 1.

Referring to the drawings, embodiments of the present invention will be described, hereinafter.

Figure 3:
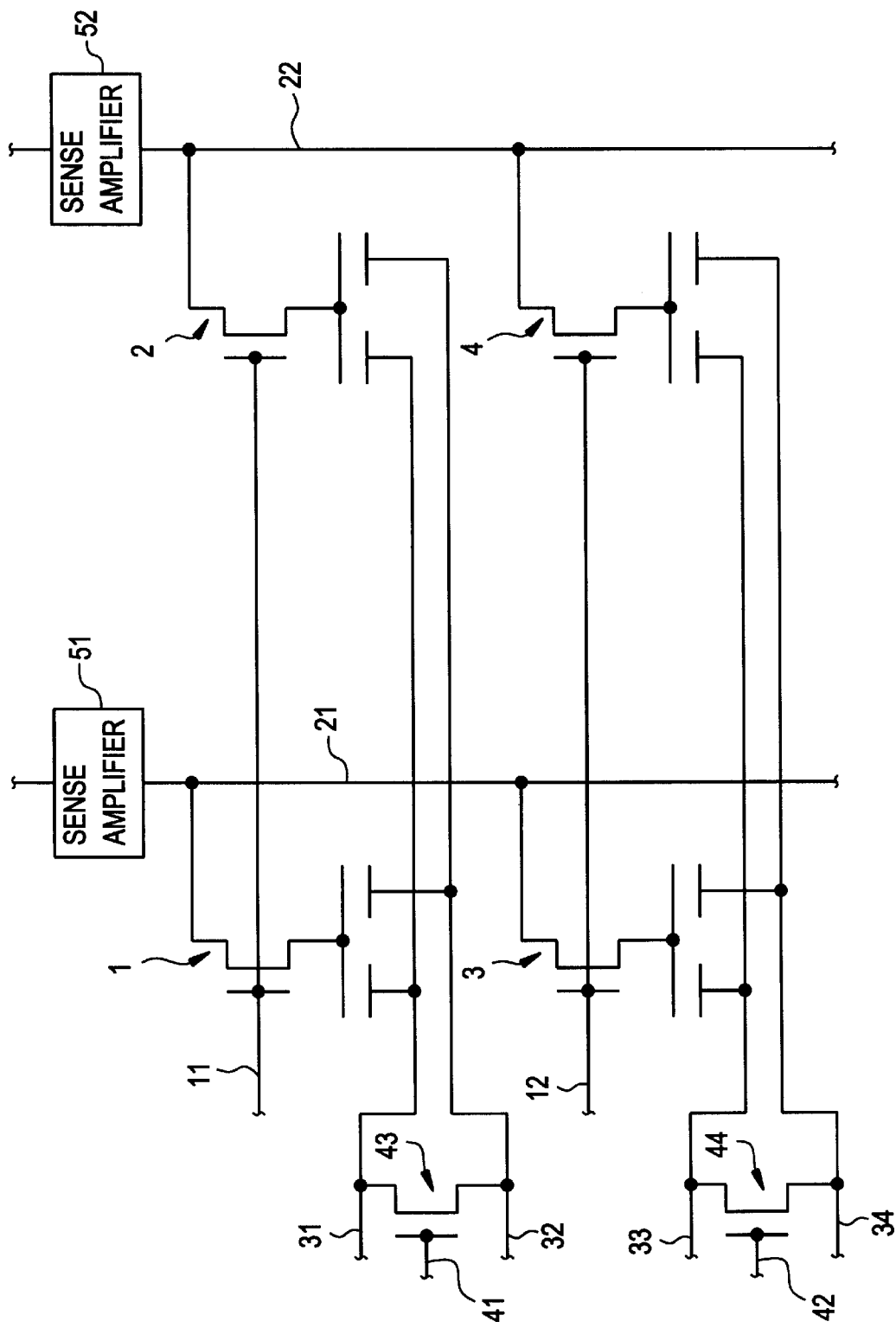
FIG. 3 is a simplified schematic circuit diagram of a ferroelectric memory in accordance with an embodiment of the present invention.

FIG. 3 is a diagram illustrating an embodiment of a ferroelectric memory according to the present invention.

This ferroelectric memory has memory elements 1, 2, 3 and 4, each of memory elements having a transistor and two ferroelectric capacitors which are connected in series to the transistor.

First word line 11 is coupled to gate electrodes of transistors in memory elements 1 and 2. Second word line 12 is coupled to gate electrodes of transistors in memory elements 3 and 4. First bit line 21 and a second bit line 22 are connected to differential-type sense amplifiers (hereinafter abbreveated as SA) 51 and 52, repectively. A pair of common lines 31 and 32 is coupled to electrodes corresponding to two ferroelectric capacitors within memory elements 1 and 2. A pair of common lines 33 and 34 is coupled to electrodes corresponding to two ferroelctric capacitors within memory elements 3 and 4. Further, common lines 31 and 32 are connected to each other through transistor 43 and common lines 33 and 34 are connected to each other through transistor 44.

Figure 4:
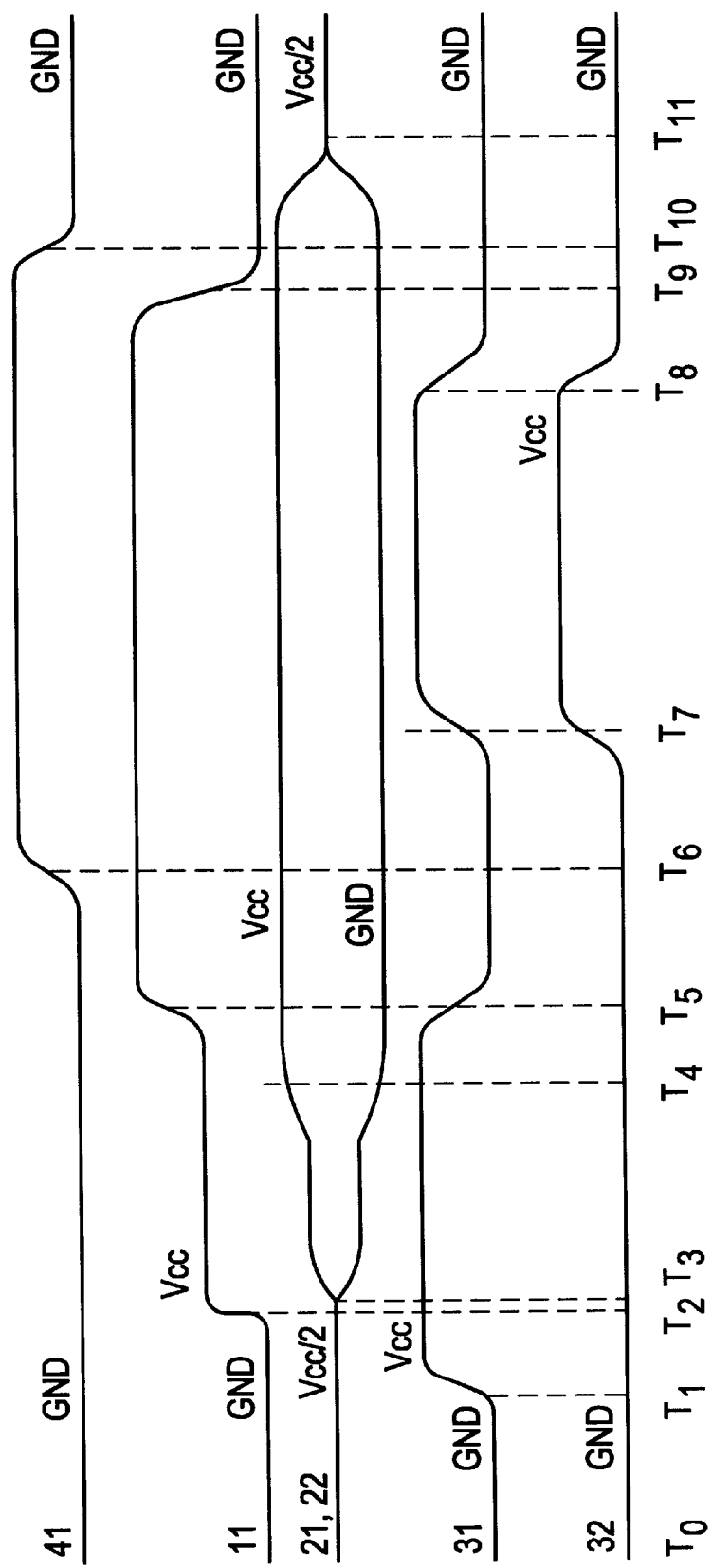
FIG. 4 is a timing chart, illustrating reading and writing operations of the ferroelectric memory of FIG. 3.
Figure 5:
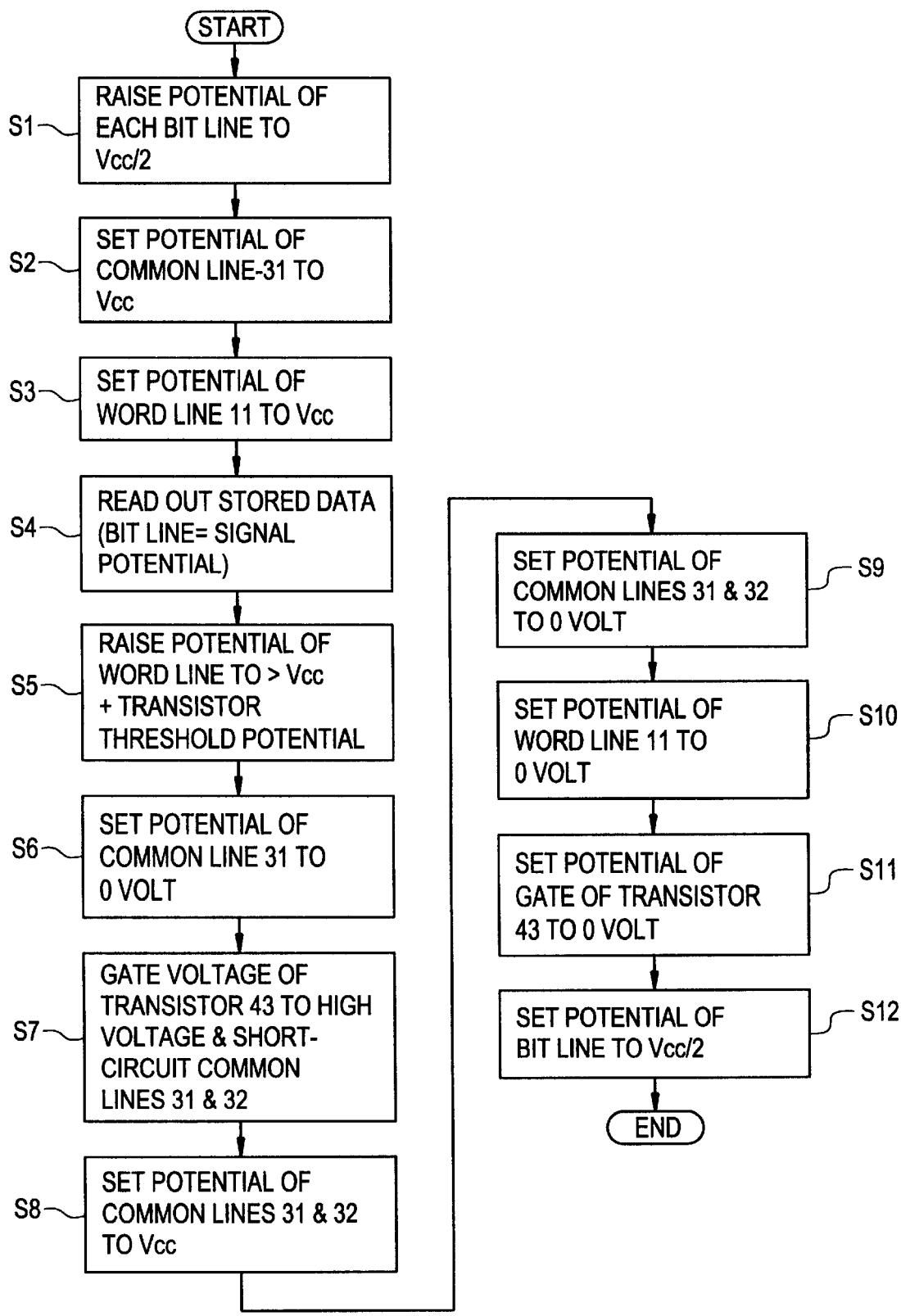
FIG. 5 is a flow chart, illustrating an operational sequence of the ferroelectric memory of FIG. 3.

Next, referring to FIGS. 4–5, an operational method of an embodiment of the present invention will be described. The method of reading data stored in memory elements 1 and 2 and then writing the data is as follows.

At time $T_0$, each of bit lines is charged to Vcc/2 in reserve (Step 1). By raising electric potentials of the common lines to Vcc at time $T_1$ (Step 2) and, subsequently, electric potential of word line 11 to Vcc at time $T_2$ (Step 3), each of electric potentials of bit lines 21 and 22 either goes up or down immeditely after $T_2$ at time $T_3$, depending upon whether data are stored in memory elements 1 and 2. Signals generated on bit lines 21 and 22 are then bound to be at either Vcc or ground at time $T_4$ by the use of SA 51 and 52 which are coupled to bit lines 21 and 22, respectively, and operate in differential mode (Step 4).

Then, in order to rewrite data onto memory elements 1 and 2, at time $T_5$, electric potential of the word line 11 is raised to a high electric potential which is a higher electric potential than Vcc+threshold voltage of the transistor (hereinafter called as a high electric potential) (Step 5), and electric potential of common line 31 is dropped to the ground potential (Step 6). So far, common line 32 is earthed. Next, at time $T_6$, electric potential of a gate electrode 41 is raised to a higher electric potential (than Vcc+threshold voltage of the transistor) (Step 7). At time $T_7$, electric potentials of common lines 31 and 32 are set to be Vcc (Step 8), and at time $T_8$, electric potentials of common lines 31 and 32 are set to be the ground potential (Step 9). Now common lines 31 and 32 are short-circuited by transistor 43 so that common lines 31 and 32 are the same electric potential. Electric potenial of word line 11 is grounded at time $T_9$ (Step 10) and electric potential of the gate electrode is grounded at time $T_{10}$ (Step 11). Electric potentials of bit lines 21 and 22 are recharged to Vcc/2 at time $T_{11}$ (Step 12), while the time sequence of $T_{10}$ and $T_{11}$ hereof can be reversed. Then, it is ready for new writing.

The embodiment of the present invention has an effect that no reversal of data which may be caused by a time lag between times of electric potential changes on two common lines 31 and 32 takes place since these common lines are short-circuited at the time of data rewriting.

As described above, the ferroelectric memory according to the present invention has an advantage that no wrong data is substituted by reversal of data at the time of rewriting. The reason for this is that two common lines connected to one and the same memory element are short-circuited at the time of data writing and thereby the reversal of polarization in ferroelectric capacitors which may be caused by a difference in electric potentials between those common lines never takes place.

What is claimed is:

1. A ferroelectric memory comprising:
    a memory cell transistor;
    a word line connected to a gate electrode of said memory cell transistor;
    a bit line connected to either a source electrode or a drain electrode of said memory cell transistor;
    two ferrolectric capacitors sharing each one terminal in common which is connected in series to the other electrode but the electrode connected to said bit line; and
    two common lines, each connected to the other terminal but the shared terminal of said two ferroelectric capacitors; further including:
        a connecting transistor for connecting said two common lines, having a gate electrode which voltage is controllable, and a drain electrode and a source electrode which are connected to each of two common lines respectively; and
        means for bringing said transistor to connect said two common lines at the time of preparing state for data writing after reading out stored data.

2. A ferroelectric memory comprising:
    a memory cell transistor;
    a word line connected to a gate electrode of said memory cell transistor;
    a bit line connected to either a source electrode or a drain electrode of said memory cell transistor;
    two ferrolectric capacitors sharing each one terminal in common which is connected in series to the other electrode but the electrode connected to said bit line;
    two common lines, each connected to the other terminal but the shared one of said two ferroelectric capacitors;
    means for reading out stored data including means for raising electric potential of the bit line to a predetermined value, means for setting electric potential of one common line at Vcc, means for setting electric potential of the word line at Vcc;
    means for preparing for next writing of new data including means for raising electric potential of the word line more than the prescribed threshold value adding to potential level Vcc, means for grounding both of said common lines, then raising electric potentials of those lines to Vcc and dropping them to 0 V again,
    further including:
        means of short-circuiting both of said common lines electrically within said means for preparing for the next writing of new data.

3. A preparation method for writing into a ferroelectric memory having a memory cell transistor; a word line connected to a gate electrode of said memory cell transistor; a bit line connected to either a source electrode or a drain electrode of said memory sell transistor; two ferroelectric capacitors sharing each one terminal in common which is connected in series to the other electrode but the electrode connected to said bit line; and two common lines, each connected to the other terminal but the shared terminal of said two ferroelectric capacitors; comprising steps of:
    for reading out stored data;
    raising electric potential of the bit line;
    raising electric potential of one of the common lines to Vcc;
    raising electric potential of the word line to Vcc; then
    raising electric potential of the word line adding more than the prescribed threshold value;
    for preparing for writing new data;
    grounding electric potentials of both common lines, then raising them to Vcc and dropping them to 0 V; and
    grounding electric potential of the word line; further including
        a step of short-circuiting said common lines electrically, within the steps of grounding the common lines, raising them to Vcc and dropping to 0 V again for preparing for the writing new data.

4. A preparation method for writing into a ferroelectric memory according to claim 3, wherein the step of short-circuiting both of said common lines electrically comprises connecting each of both of said common lines to a source electrode and a drain electrode of said connecting transistor respectively and raising electric potential of a gate electrode of the transistor to connect said drain and source electrode.

* * * * *